(12) United States Patent
Niu et al.

(10) Patent No.: US 11,018,315 B2
(45) Date of Patent: May 25, 2021

(54) SUBSTRATE AND METHOD OF PRODUCING THE SAME WITH DISPLAY APPARATUS AND PRODUCING METHOD THEREOF

(71) Applicant: BOE Technology Group Co., Ltd., Beijing (CN)

(72) Inventors: Yanan Niu, Beijing (CN); Dacheng Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 157 days.

(21) Appl. No.: 15/577,864

(22) PCT Filed: Jun. 7, 2017

(86) PCT No.: PCT/CN2017/087448
§ 371 (c)(1),
(2) Date: Nov. 29, 2017

(87) PCT Pub. No.: WO2018/036242
PCT Pub. Date: Mar. 1, 2018

(65) Prior Publication Data
US 2018/0294434 A1    Oct. 11, 2018

(30) Foreign Application Priority Data

Aug. 25, 2016 (CN) .......................... 201610720891.7

(51) Int. Cl.
*H01L 51/52* (2006.01)
*B32B 3/30* (2006.01)
(Continued)

(52) U.S. Cl.
CPC ............ *H01L 51/5246* (2013.01); *B32B 3/30* (2013.01); *G03F 1/32* (2013.01); *G03F 7/0007* (2013.01);
(Continued)

(58) Field of Classification Search
CPC .... B32B 3/28; B32B 3/30; B32B 3/06; B32B 2457/202; B32B 2457/206;
(Continued)

(56) References Cited

U.S. PATENT DOCUMENTS 6,704,072 B2   3/2004   Jeong et al.
7,145,290 B2   12/2006  Kang
(Continued)

FOREIGN PATENT DOCUMENTS

CN      1380634 A      11/2002
CN      1404162 A      3/2003
(Continued)

OTHER PUBLICATIONS

Translation of CN102262319. (Year: 2011).*
(Continued)

*Primary Examiner* — Catherine A. Simone
(74) *Attorney, Agent, or Firm* — Westman, Champlin & Koehler, P.A.

(57) ABSTRACT

The present disclosure involves in a substrate and a method of producing the same, and a display apparatus and a method of producing the same. The substrate includes a base substrate, at least comprising an adhering region and an alignment area adjacent to the adhering region; a covering layer disposed on the base substrate, wherein a part of the covering layer located in the adhering region comprises an adhesive providing region and non-adhesive providing regions located at both sides of the adhesive providing region, wherein a groove is provided on a top of the adhesive providing region of the covering layer.

18 Claims, 7 Drawing Sheets

(51) Int. Cl.
*H01L 51/56* (2006.01)
*G03F 7/20* (2006.01)
*G03F 7/26* (2006.01)
*G03F 1/32* (2012.01)
*G03F 7/00* (2006.01)
*G03F 7/16* (2006.01)

(52) U.S. Cl.
CPC .......... *G03F 7/16* (2013.01); *G03F 7/20* (2013.01); *G03F 7/26* (2013.01); *H01L 51/524* (2013.01); *H01L 51/5243* (2013.01); *H01L 51/56* (2013.01); *B32B 2457/206* (2013.01); *Y10T 428/24479* (2015.01); *Y10T 428/24612* (2015.01)

(58) Field of Classification Search
CPC ........... H01L 51/5246; H01L 51/524; H01L 51/5243; H01L 51/56; G03F 1/32; G03F 7/0007; G03F 7/16; G03F 7/20; G03F 7/26; Y10T 428/24479; Y10T 428/2457; Y10T 428/24612; Y10T 428/28
USPC .................. 428/141, 156, 167, 166
See application file for complete search history.

(56) References Cited

U.S. PATENT DOCUMENTS

| | | | |
|---|---|---|---|
| 7,795,803 | B2 | 9/2010 | Kim et al. |
| 8,405,293 | B2 | 3/2013 | Han et al. |
| 2002/0149730 | A1 | 10/2002 | Jeong et al. |
| 2003/0012516 | A1* | 1/2003 | Matsumoto .......... G02B 6/3676 385/71 |
| 2003/0042852 | A1 | 3/2003 | Chen |
| 2005/0116636 | A1 | 6/2005 | Kang |
| 2007/0176548 | A1 | 8/2007 | Kim et al. |
| 2011/0127548 | A1 | 6/2011 | Lee |
| 2012/0056523 | A1 | 3/2012 | Han et al. |

FOREIGN PATENT DOCUMENTS

| | | | |
|---|---|---|---|
| CN | 1622700 | A | 6/2005 |
| CN | 1805130 | A | 7/2006 |
| CN | 101009303 | A | 8/2007 |
| CN | 101452986 | A | 6/2009 |
| CN | 102262319 | A | 11/2011 |
| CN | 102662276 | A | 9/2012 |
| CN | 103337511 | A | 10/2013 |
| CN | 103551095 | A | 1/2014 |
| CN | 203707134 | U | 7/2014 |
| CN | 104538555 | A | 4/2015 |
| CN | 105576148 | A | 5/2016 |
| CN | 106206987 | A | 12/2016 |
| KR | 20060077466 | A | 7/2006 |
| KR | 100643891 | B1 | 11/2006 |

OTHER PUBLICATIONS

International Search Report and English translation of International Search Report for International Application No. PCT/CN2017/087448, dated Sep. 12, 2017, 8 pages.
Written Opinion and English translation of Box Nos. 1, 2 and 5 of Written Opinion for International Application No. PCT/CN2017/087448, dated Sep. 12, 2017, 10 pages.
First Office Action, for Chinese Patent Application No. 201610720891.7, dated Aug. 2, 2017, 14 pages.
Second Office Action, for Chinese Patent Application No. 201610720891.7, dated Jan. 17, 2018, 15 pages.

* cited by examiner

SUBSTRATE AND METHOD OF PRODUCING THE SAME WITH DISPLAY APPARATUS AND PRODUCING METHOD THEREOF

CROSS-REFERENCE TO RELATED APPLICATION

This application is a Section 371 National Stage Application of International Application No. PCT/CN2017/087448, filed Jun. 7, 2017, which is not yet published, and claims priority of Chinese Patent Application No. 201610720891.7 filed on Aug. 25, 2016 in the State Intellectual Property Office of China, the contents of which are incorporated in their entirety herein by reference.

BACKGROUND

Technical Field

The present disclosure relates to a field of display technology, and more particularly, to a substrate and a producing method thereof as well as a display apparatus and a producing method thereof.

Description of the Related Art

With rapid development of display technology, semiconductor element technology being considered as key point of the display apparatus also achieves a big forward step. As for the existing display apparatus, OLED (Organic Light Emitting Diode) is one kind of current based light emitting devices, and is increasingly used in display field of high performance due to advantages such as self-luminance, rapid responding speed, wide view angle and capability of being produced on a flexible substrate.

According to driving mode, the OLEDs can be classified as two categories, i.e., PMOLED (Passive Matrix Driving OLED) and AMOLED (Active Matrix Driving OLED). Because the AMOLED display devices have advantages such as low manufacturing cost, high responding speed, power-saving, a DC driving usable in portable equipment, a wide range of working temperature and the like, they have been expected to replace LCDs (Liquid Crystal Display) as a next generation of flat displays. In the current AMOLED display panels, each OLED includes a plurality of TFT (Thin Film Transistor) switch circuits. Further, Low temperature Poly Silicon TFTs, due to the superior electrical characteristic in a quiescent condition, have been applied in the applications of liquid crystal display, matrix image sensor or the like, as one kind of important electronic devices.

SUMMARY

Embodiments of present disclosure provide a substrate and a method of producing the same, and a display apparatus and a method of producing the same, which can at least partially solve the problem of poor sealing effect and bad reliability in the prior art.

One object of the present disclosure is to provide a substrate.

In one aspect of the present disclosure, it provides a substrate comprising:

a base substrate, at least comprising an adhering region and an alignment region adjacent to the adhering region;

a covering layer disposed on the base substrate, wherein a portion of the covering layer located in the adhering region comprises an adhesive providing region and non-adhesive providing regions located at both sides of the adhesive providing region, wherein a groove is provided on a top of the adhesive providing region of the covering layer.

In one example, the groove has a width not less than about 5 μm.

In one example, an area of a projection of the groove onto the base substrate is not more than about 50% of an area of a projection of the adhesive providing region onto the base substrate.

In one example, the adhesive providing region comprises a first region, a second region and a third region, the second region being located between the first region and the third region, and a depth of the groove in the second region is larger than the depth of the groove in each of the first region and the third region.

In one example, a ratio of an area of the second region to an area of the adhesive providing region is in a range of approximately 1% to 99%.

In one example, a ratio of a depth of the groove to a thickness of the covering layer is in a range of about 1%-99%.

In one example, the substrate further comprises a first protrusion and a second protrusion between the base substrate and the covering layer, and the first and second protrusions are located within the adhering region and located at both sides of the adhesive providing region.

In one example, the substrate further comprises a third protrusion located between the base substrate and the covering layer, the third protrusion being located in the alignment region; and the first protrusion, the second protrusion and the third protrusion comprise metal.

In one example, the covering layer comprises at least one of the followings: silicon oxide, silicon nitride, and a combination thereof, and the base substrate comprises a glass substrate.

In one example, a thickness of the covering layer is in a range of about 500-2000 Å.

Another object of the present disclosure aims to provide a display apparatus.

In a second aspect of the present disclosure, it provides a display apparatus, comprising the substrate as described above.

A further object of the present disclosure aims to provide a method of producing the substrate.

In a third aspect of the present disclosure, it provides a method of producing a substrate, comprising:

providing a base substrate at least comprising an adhering region and an alignment region adjacent to the adhering region;

forming a covering layer on the base substrate, a portion of the covering layer located in the adhering region comprising an adhesive providing region and non-adhesive providing regions at both sides of the adhesive providing region;

wherein the method of producing the substrate further comprises forming a groove on a top of the adhesive providing region of the covering layer.

In one example, the adhesive providing region comprises a first region, a second region and a third region, the second region being located between the first region and the third region, and the step of forming the groove comprises forming the groove such that a depth of the groove in the second region is larger than the depth of the groove in each of the first region and the third region.

In one example, the step of forming the groove comprises:
forming a photoresist on the covering layer;
performing exposure and development processes to form hole-slots on the photoresist, wherein the exposure process is performed by a mask having a first area, a second area and a third area, wherein light transitivity of the first area is larger than that of the second area, and the light transitivity of the second area is larger than that of the third area;
at a portion of the mask which corresponds to the first region and the third region, the second area and the third area are arranged alternately, so that a first hole-slot and a third hole-slot are respectively formed in a region of the photoresist corresponding to the first region and the third region; and
at a portion of the mask which corresponds to the second region, the first area and the third area are arranged alternately, so that a second hole-slot is formed in a region of the photoresist corresponding to the second region, wherein a depth of the second hole-slot is larger than that of each of the first hole-slot and the third hole-slot;
performing an etching to penetrate the photoresist so that the grooves are formed in the first region, the second region and the third region of the covering layer; and
removing the photoresist.

In one example, the mask comprises a half-tone mask.

In one example, a ratio of an area of the second region to an area of the adhesive providing region is in a range of approximately 1% to 99%.

In one example, the groove has a width not less than about 5 μm; and a ratio of a depth of the groove to a thickness of the covering layer is in a range of about 1%-99%.

In one example, the method of producing the substrate further comprises: forming a metal layer on the base substrate, followed by forming the covering layer;
patterning the metal layer to form a first protrusion, a second protrusion and a third protrusion, wherein the first and second protrusions are located within the adhering region and located at both sides of the adhesive providing region; and the third protrusion is located in the alignment region.

A yet further object of the present disclosure aims to provide a method of producing the display apparatus.

In a fourth aspect of the present disclosure it provides a method of producing a display apparatus, comprising the method of producing the substrate as described above.

In one example, the depth of the groove is not more than 50% of the thickness of the covering layer.

BRIEF DESCRIPTION OF THE DRAWINGS

In order to more clearly illustrate the technical solutions of the embodiments of the present disclosure, the drawings, which are used in the description of the embodiments, will be briefly described below. It will be apparent that the drawings in the following description only represent some embodiments of the present disclosure, rather than limiting to the present disclosure.

DETAILED DESCRIPTION OF PREFERRED EMBODIMENTS

In order to more clearly provide the objectives, technical solutions and advantages of the embodiments of the present disclosure, the technical solutions in the embodiments of the present disclosure will be clearly and completely described below, with reference to the accompanying drawings in the embodiments of the present disclosure. It will be apparent that the described embodiments only represent a part of the present disclosure, rather than all the embodiments of the present disclosure. All other embodiments obtained by those skilled in the art based on the embodiments of the present disclosure without creative efforts fall within the scope of the present disclosure.

When introducing elements and embodiments of the present disclosure, a singular form of terms used in the present text and the attached claims also includes a plural form thereof, unless being explicitly specified in the context; and vice versa. Therefore, upon mentioning the singular form thereof, it normally means including the plural form of the corresponding term. Terms "including", "comprising", "containing" and "having" are intended to be inclusive, and mean the possibility of existence of other element than the listed elements herein.

For sake of brevity of description below, as the directions indicated in the drawings, terms "upper", "lower", "left", "right", "perpendicular", "horizontal", "top", "bottom" as well as derivatives thereof are involved in the present disclosure. Terms "coated . . . above", "on a top of", "located onto . . . " or "positioned on a top of . . . " means that a first element of a first structure is present on a second element of a second structure, for example. There is also possible to have an intermediate element (for example an interface structure) between the first element and the second element.

Term "contact" means connecting the first element of the first structure and the second element of the second structure, while other elements can or cannot be present at an interface of the two elements.

However, the light emitting layer in the OLED devices is very sensitive to the pollutants, $O_2$ or water in the atmosphere, and thus packaging technology of the OLED devices would directly affect stability and lifetime of the OLED devices. However, the current packing technique does not have desirable effect.

In accordance with a packaging process of an OLED, frit or frit adhesive will be coated on a cover glass, depending on specific requirements of patterns on the panel. Then, a backing glass and the cover glass are aligned to be attached. A region where the frit adhesive is located is illuminated by a laser beam so as to melt the frit, thereby sealing the backing glass and the cover glass. After such package, there is a big difference of air pressure outside and inside the sealed device, and thus a portion of the frit in which is not completely solidified will be readily deformed due to an influence of the air pressure. In a severe case, there is occurrence of puncturing holes at a thinnest part of the sealed device, resulting in leakage of air. After such deformation is generated, it tends to have reliability issues or have an adverse effect on the lifetime of the product, even if the laser solidification has been finished.

Figure 1:
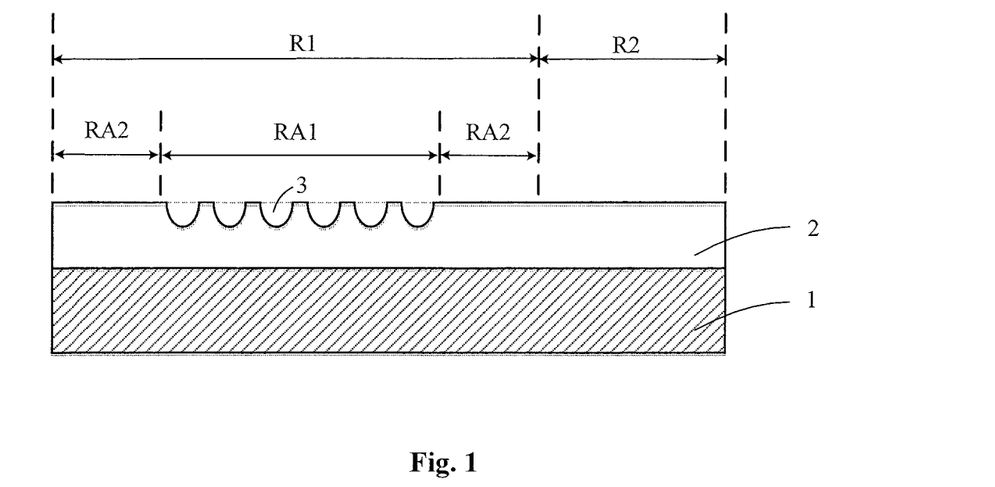
FIG. 1 is a schematic view of a substrate in accordance with an embodiment of the present disclosure.

FIG. 1 is a schematic view of a substrate in accordance with an embodiment of the present disclosure. As shown in FIG. 1, the substrate includes a base substrate 1 at least including an adhering region R1 and an alignment area R2 adjacent to the adhering region R1; a covering layer 2 disposed on the base substrate 1, a part of which located in the adhering region R1 includes an adhesive providing region RA1 and non-adhesive providing regions RA2 located at both sides of the adhesive providing region RA1. A groove 3 is provided on a top of the adhesive providing region RA1 of the covering layer 2.

The provision of the groove at the top of the adhesive providing region of the covering layer may increase a contact area between the adhesive and the covering layer during subsequent usage, producing an anchoring effect. Thereby, it may enforce the adhering capacity of the adhesive to the substrate.

It should be noted that a sectional shape of the groove in FIG. 1 to be circular is taken as an example and gives out an illustrative explanation. The shape of the groove may also be set according to the actual requirement. For example, the sectional shape of the groove may include at least one of circle, ellipse and square.

In one embodiment, the groove may have a width not less than about 5 µm, so as to obtain a better anchoring effect. It should be understood that the expression "width of the groove" mentioned herein refers to a largest distance between any two points within a projection of the groove onto the base substrate. In one embodiment, in order to prevent the adverse influence onto the strength of the covering layer, an area of the projection of the groove onto the base substrate may be set to be not more than about 50% of an area of a projection of the adhesive providing region on the base substrate. The depths of the grooves may be the same or different.

Figure 2:
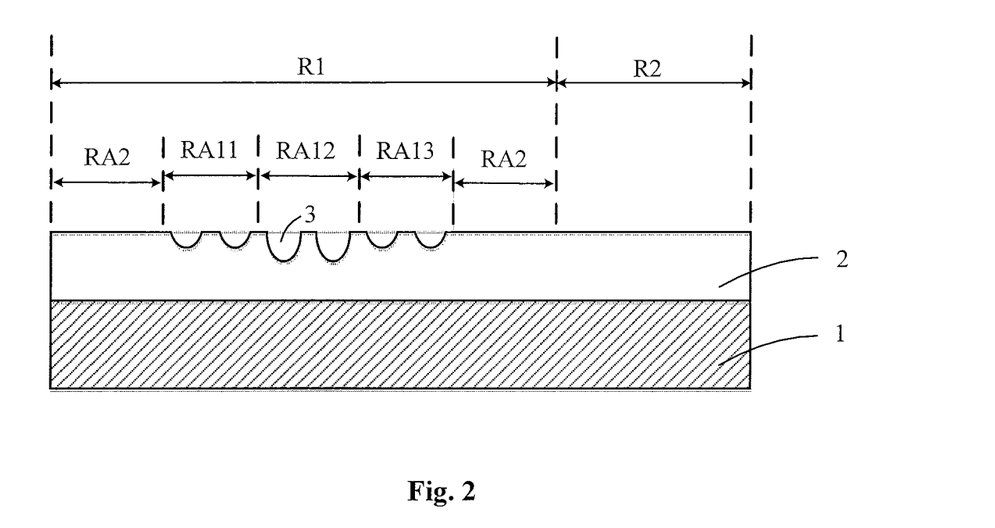
FIG. 2 is a schematic view of a substrate in accordance with an embodiment of the present disclosure.

FIG. 2 is a schematic view of the substrate in accordance with an embodiment of the present disclosure. As shown in FIG. 2, the adhesive providing region RA1 includes a first region RA11, a second region RA12 and a third region RA13. The second region RA12 is located between the first region RA11 and the third region RA13, and a depth of the groove in the second region RA12 is larger than a depth of the groove in the first region RA11 or the third region RA13. That is, the adhesive providing region is of such a structure that deep grooves are located at a middle part of the adhesive providing region while shallow grooves are located at both ends thereof. In other words, the first region RA11 and the third region RA13 are shallow groove regions, while the second region RA12 is a deep groove region.

The arrangement of the embodiment shown in FIG. 2 may increase the contact area between the adhesive and the covering layer, and the anchoring effect will enforce the adhering ability of the adhesive such as Frit to the substrate. The Frit is taken as one example of the adhesive below to give out an illustrative explanation. Followed by the laser illumination, an uneven surface of the covering layer may increase the contact area and the Frit part in the groove, so that a fixation force of the Frit with the substrate may be enforced. Upon the laser illumination, the Frit in a molten state will fill up holes at the middle part under the force of pressure. In an arrangement in which deep grooves are at the middle part and the shallow grooves are at both sides thereof, the adverse influence may be reduced as much as possible, which adverse influence is caused by the particles in the Frit or the like, that is, even if the Frit in the shallow hole regions at edges are jacked-up by particles or the like so as to generate micro gaps, whereas the Frit at the middle deep hole region will subject to relatively smaller influence, thereby maintaining the sealing of the package glass.

FIG. 2 shows an example that the grooves in the first region RA11 and the third region RA13 have substantially the same depth. However, they can have different depths alternatively. In the example of FIG. 2, a bottom of the groove does not arrive at a level of the upper surface of the base substrate. However, it is also possible to set the bottom of the groove to arrive at the level of the upper surface of the base substrate as actually required.

In one embodiment, a ratio of an area of the second region RA12 to an area of the adhesive providing region RA is in a range of approximately 1% to 99% (for example, the ratio may be in a range of approximately 30%-50%). The ratio of the groove depth to a thickness of the covering layer is in a range of about 1%-99%. Taking into consideration of the adherence of the covering layer to the base substrate, in one embodiment, the depth of the groove is not more than about 50% of the thickness of the covering layer.

Figure 3:
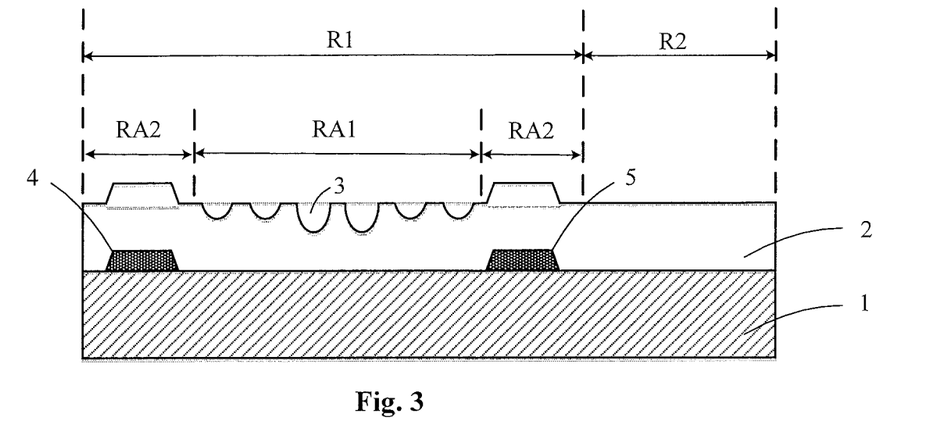
FIG. 3 is a schematic view of a substrate in accordance with an embodiment of the present disclosure.

FIG. 3 is a schematic view of a substrate in accordance with an embodiment of the present disclosure. As shown in FIG. 3, the substrate also includes a first protrusion 4 and a second protrusion 5 between the base substrate 1 and the covering layer 2, and the first and second protrusions 4 and 5 are located within the adhering region R1 and located at both sides of the adhesive providing region RA1.

Non-continuous protrusions (for example, the metal protrusion region(s)) are formed at two sides of the adhesive providing region RA1, which may further fix and restrict the position of the adhesive such as Frit. As below, the Frit is taken as an example of the adhesive for illustrative explanation. Since the Frit itself does not have a sufficiently large adhesion to the substrate before the solidification is performed by the laser illumination, such protrusions may function similar to a clip and increase the adhering effect thereof. Meanwhile, after adding the protrusion and during the laser illumination, the protrusions will restrict the out-flow of the Frit in the molten state to an extent, thereby reducing the failure of products caused by the flowing of the Frit to the region outside the adhesive providing region.

Figure 4:
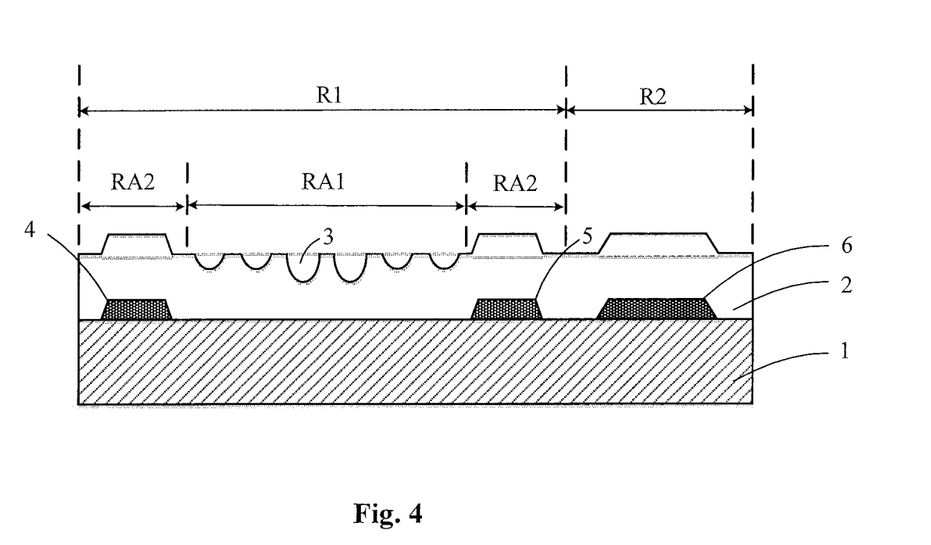
FIG. 4 is a schematic view of a substrate in accordance with an embodiment of the present disclosure.

FIG. 4 is a schematic view of the substrate in accordance with an embodiment of the present disclosure. Unlike the substrate in FIG. 3, the substrate in FIG. 4 further includes a third protrusion 6 located between the base substrate 1 and the covering layer 2. The third protrusion 6 is located in the alignment region R2. In one embodiment, the first protrusion 4, the second protrusion 5 and the third protrusion 6 include metal. The third protrusion may function as an alignment mark in a cell-assembling process of the different substrates.

Figure 5:
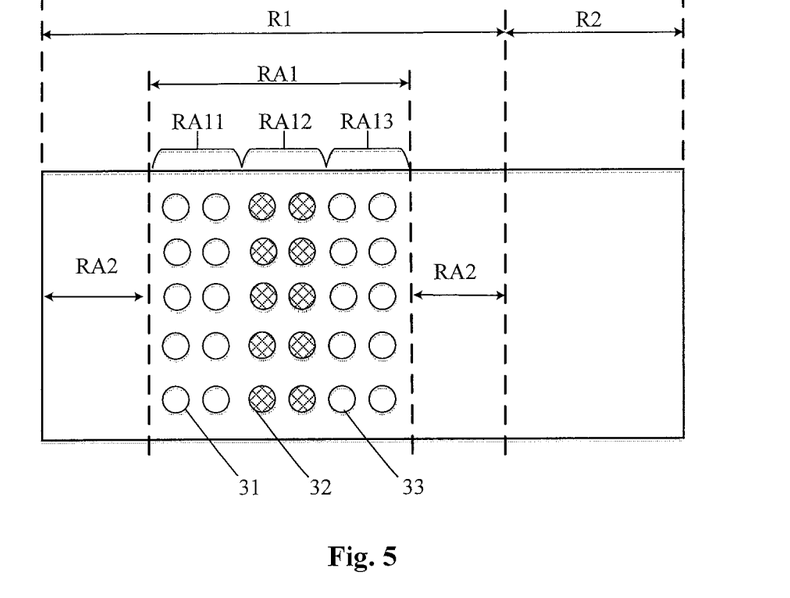
FIG. 5 is a top view of a substrate in accordance with an embodiment of the present disclosure.

FIG. 5 is a top view of the substrate in accordance with an embodiment of the present disclosure. As shown in FIG. 5, the adhesive providing region RA1 includes a first region RA11, a second region RA12 and a third region RA13. The second region RA12 is located between the first region RA11 and the third region RA13. The grooves in the adhesive providing region include the grooves of different thicknesses. In other words, in FIG. 5, the first region RA11, the second region RA12 and the third region 13 differ from one another in depths of the grooves thereof. The depths of the grooves 32 in the second region RA12 are larger than the depths of the grooves 31 in the first region RA11, and the depths of the grooves 32 in the second region RA12 are also larger than those of the grooves 33 in the third region RA13.

It should be noted that the projection of the groove on the base substrate to be circular is taken as one example to make an illustrative explanation. The shape of projection of the groove on the base substrate can include at least one of the circle, ellipse and square. The grooves may be regularly arranged as shown in FIG. 5 and also may be irregularly arranged.

The base substrate includes but is not limited to a glass substrate. The material of the covering layer includes at least one kind as listed below: silicon oxide, silicon nitride, and a combination thereof. However, the covering layer may also be set to include other materials as actually required. In one embodiment, the thickness of the covering layer is in a range of about 500-2000 Å. Once the covering layer is too thick, it will increase the producing cost.

Another aspect of the present disclosure provides a method for producing a substrate, including the steps of:

providing a base substrate at least including an adhering region and an alignment region adjacent to the adhering region;

forming a covering layer on the base substrate, a part of the covering layer located in the adhering region including an adhesive providing region and non-adhesive providing regions at both sides of the adhesive providing region;

the producing method of the substrate further includes forming a groove on a top of the adhesive providing region of the covering layer.

Figure 6:
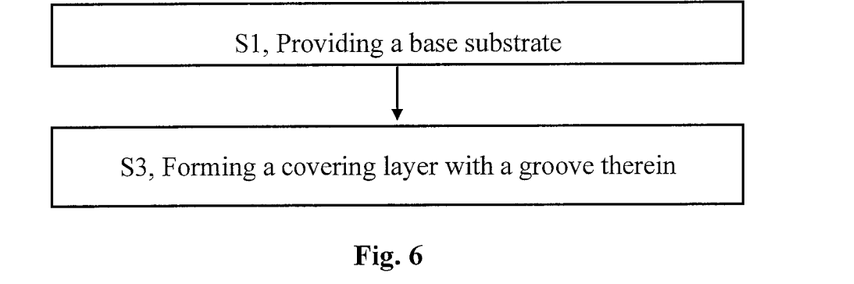
FIG. 6 is a flow chart of a producing method of a substrate in accordance with an embodiment of the present disclosure.

FIG. 6 is a flow chart of a method for producing a substrate in accordance with an embodiment of the present disclosure. As shown in FIG. 6, the method for producing the substrate includes:

S1, providing a base substrate at least including an adhering region and an alignment region adjacent to the adhering region;

S3, forming a covering layer on the base substrate, a part of the covering layer located in the adhering region including an adhesive providing region and non-adhesive providing regions at both sides of the adhesive providing region; wherein a groove is provided on a top of the adhesive providing region of the covering layer.

The adhesive providing region may include a first region, a second region and a third region. The second region is located between the first region and the third region, and the depth of the groove in the second region is larger than the depth of the groove in the first region or the third region.

A ratio of an area of the second region to an area of the adhesive providing region is in a range of approximately 1% to 99% (for example, the ratio may be in a range of approximately 30%-50%). The groove may have a width not less than about 5 μm, and the ratio of the groove depth to the thickness of the covering layer is in a range of about 1%-99%. For example, the depth of the groove is not more than about 50% of the thickness of the covering layer.

Figure 7:
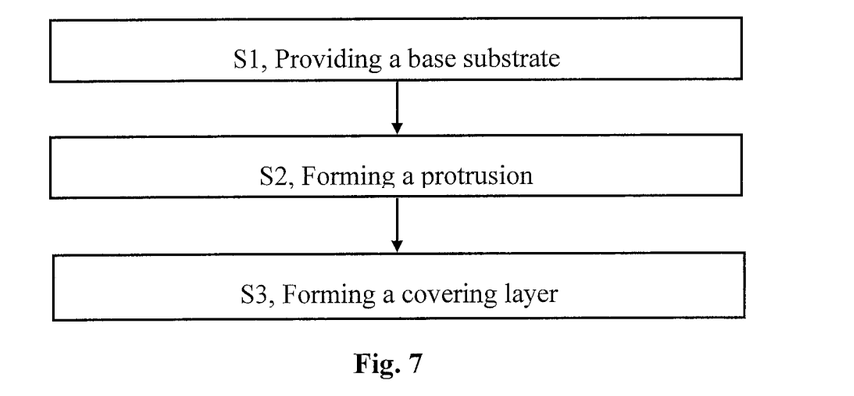
FIG. 7 is a flow chart of a producing method of a substrate in accordance with an embodiment of the present disclosure.

FIG. 7 is a flow chart of a method for producing a substrate in accordance with an embodiment of the present disclosure. As shown in FIG. 7, the method for producing the substrate includes:

S1, providing a base substrate at least including an adhering region and an alignment region adjacent to the adhering region;

S2, forming a first protrusion, a second protrusion and a third protrusion between the base substrate and the covering layer, in which the first and second protrusions are located within the adhering region and located at both sides of the adhesive providing region; and the third protrusion is located in the alignment region.

S3, forming a covering layer on the base substrate, a part of the covering layer located in the adhering region including an adhesive providing region and non-adhesive providing regions at two sides of the adhesive providing region; wherein a groove is provided on a top of the adhesive providing region of the covering layer.

Figure 8:
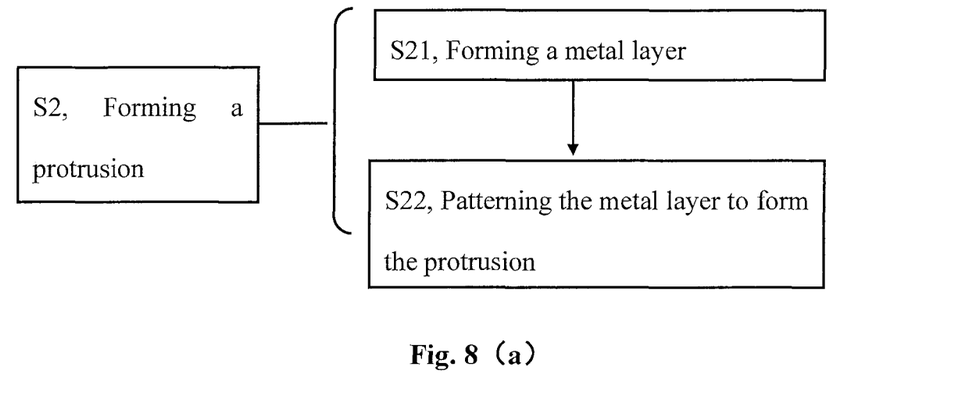
FIG. 8(a) is a flow chart of a method of forming a first projection, a second projection and a third projection in accordance with an embodiment of the present disclosure.
FIG. 8(b) is a flow chart of a method of forming a capping layer in accordance with an embodiment of the present disclosure.

FIG. 8(a) is a flow chart of a method of forming a first protrusion, a second protrusion and third protrusion in accordance with an embodiment of the present disclosure. As shown in FIG. 8(a), the step S2 of forming the first protrusion, the second protrusion and the third protrusion can include:

S21, forming a metal layer on the base substrate followed by forming the covering layer;

S22, patterning the metal layer so as to form a first protrusion, a second protrusion and a third protrusion, wherein the first and second protrusions are located within the adhering region and located at both sides of the adhesive providing region; and the third protrusion is located in the alignment region.

FIG. 8(b) is a flow chart of a method of forming the covering layer in accordance with an embodiment of the present disclosure. As shown in FIG. 8(b), the step S3 of forming the covering layer on the base substrate includes:

S31, forming a basic covering layer on an exposed part of the first, second and third protrusions and the base substrate;

S32, providing a photoresist on the basic covering layer,

S33, performing exposure and development processes; and

S34, performing an etching process to create a covering layer which is provided with the groove.

Figure 9:
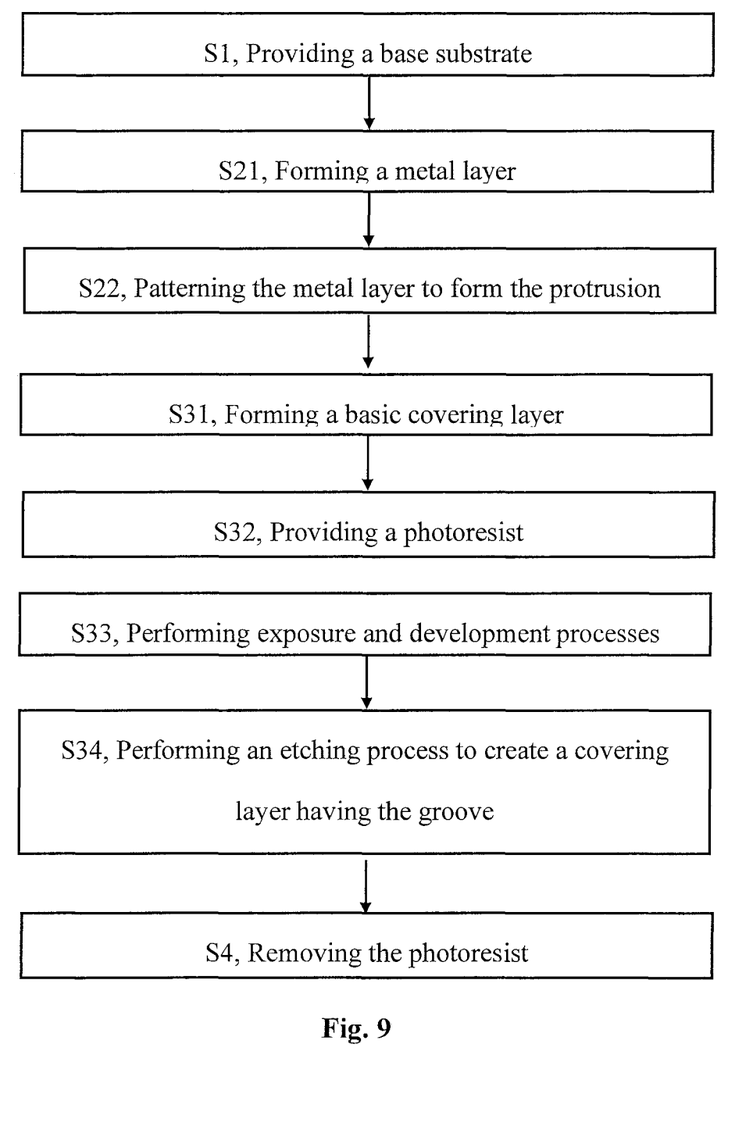
FIG. 9 is a flow chart of a producing method of a substrate in accordance with an embodiment of the present disclosure.

FIG. 9 is a flow chart of a method of producing a substrate in accordance with an embodiment of the present disclosure. As shown in FIG. 9, the method of producing the substrate includes the following steps:

S1, providing a base substrate;

S21, forming a metal layer on the base substrate;

S22, patterning the metal layer to form the first, second and third protrusions, wherein the first and second protrusions are located within the adhering region and located at both sides of the adhesive providing region; and the third protrusion is located in the alignment region;

S31, forming a basic covering layer on an exposed part of the first, second and third protrusions and the base substrate;

S32, providing a photoresist on the basic covering layer,
S33, performing exposure and development processes;
S34, performing an etching process to create a covering layer which is provided with the groove; and
S4, removing the photoresist.

Figure 10:
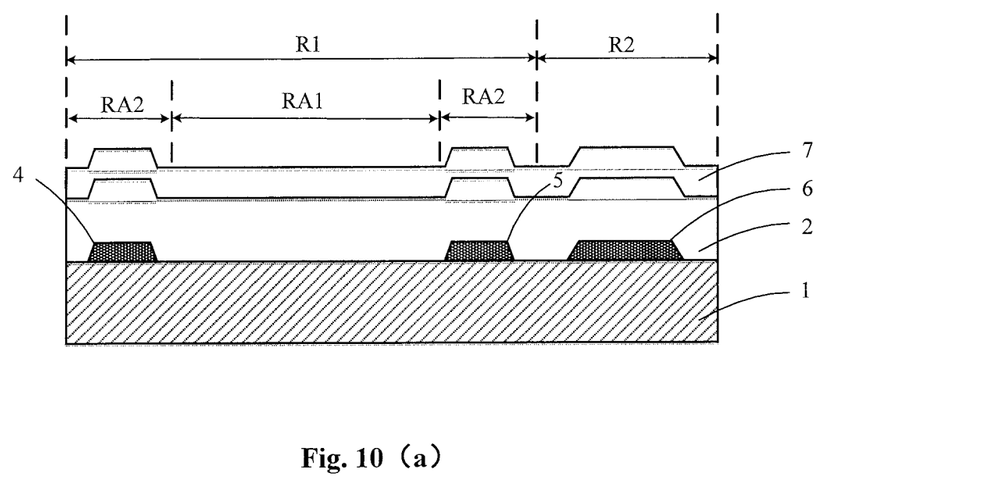
FIG. 10(a) is a schematic view of a producing method of a substrate in accordance with an embodiment of the present disclosure.
FIG. 10(b) is a further schematic view of a producing method of a substrate in accordance with an embodiment of the present disclosure.
FIG. 10(c) is a further schematic view of a producing method of a substrate in accordance with an embodiment of the present disclosure.
FIG. 10(d) is a schematic view of a producing method of a substrate in accordance with an embodiment of the present disclosure.
FIG. 10(e) is a schematic view of a producing method of a substrate in accordance with an embodiment of the present disclosure.

FIG. 10(a) is a schematic view of a method of producing a substrate in accordance with an embodiment of the present disclosure. As shown in FIG. 10(a), it provides a base substrate 1 which at least includes an adhering region R1 and an alignment area R2 adjacent to the adhering region R1. Optionally, first, second and third protrusions 4, 5 and 6 are provided on the base substrate 1. A covering layer 2 is provided on an exposed surface of the first, second and third protrusions 4, 5 and 6 and the base substrate 1. A part of the covering layer 2 located in the adhering region R1 includes an adhesive providing region RA1 and non-adhesive providing regions RA2 located at both sides of the adhesive providing region RA1. A photoresist 7 is formed on the covering layer.

FIG. 10(b) is a further schematic view of a method of producing a substrate in accordance with an embodiment of the present disclosure. As shown in FIG. 10(b), a mask 8 having a first area A1, a second area A2 and a third area A3 is adopted to perform the exposure process. The light transitivity of the first area A1 is larger than that of the second area A2, and the light transitivity of the second area A2 is larger than that of the third area A3. At the part of the mask 8 which corresponds to the first region RA11 and the third region RA13, the second area A2 and the third area A3 are arranged alternately. At the part of the mask 8 which corresponds to the second region RA22, the first part A1 and the third area A3 are arranged alternately. The mask 8 may be used to expose differently the photoresist 7, so as to form hole-slots having different depths in the photoresist.

In one implementation, the mask may be a half-tone mask, in which the first area is a transparent part, the second area is a semi-transparent part and the third area is an opaque part.

FIG. 10(c) is a further schematic view of a method of producing a substrate in accordance with an embodiment of the present disclosure. The arrangement shown in FIG. 10(b) is developed to obtain that shown in FIG. 10(c). As seen from FIG. 10(c), hole-slots (or hole-like slots) of different depths are formed in the part of the photoresist 7 corresponding to the adhesive providing region. Specifically, a first hole-slot 91 and a third hole-slot 93 are respectively formed in the areas of the photoresist 7 corresponding to the first region RA11 and the third region RA13. A second hole-slot 92 is formed in an area of the photoresist 7 corresponding to the second region RA12. The depth of the second hole-slot 92 is larger than that of the first hold-slot 91 or the third hole-slot 93. It should be noted that FIG. 10(c) shows the bottom of the second hole-slot 92 arrives at the level of the upper surface of the covering layer 6, which is taken as one example. Alternatively, it is also possible for the second hole-slot to have its bottom not arrive at the level of the upper surface of the covering layer 6.

FIG. 10(d) is a yet further schematic view of a method of producing a substrate in accordance with an embodiment of the present disclosure. The arrangement shown in FIG. 10(c) is etched so obtain that shown in FIG. 10(d). As shown in FIG. 10(d), after the etching, the photoresist 7 is penetrated through, such that grooves 3 is formed in the first region RA11, the second region RA12 and the third region RA13 of the covering layer 2. The etching process may adopt a dry etch. During the etching process, the gas for example $CF_4$, $SF_6$, $CF_3H$, $C_2F_5H$, $O_2$ or the like may be used.

FIG. 10(e) is a yet another schematic view of a method of producing a substrate in accordance with an embodiment of the present disclosure. The photoresist in the arrangement of FIG. 10(d) is removed, to obtain that shown in FIG. 10(e).

An embodiment of the present disclosure also provides a display apparatus and a method of producing the display apparatus. The display apparatus includes the substrate as described above. The method of producing the above display apparatus includes the method of producing the above substrate. In embodiments of the present disclosure, the display apparatus can be any products or components having display function, for example mobile phones, tablet computers, TVs, laptop computers, digital photo frames, and navigators or the like.

Embodiments of the present disclosure provide technical solutions which can at least partially solve the problem that the sealing effect is not good and the reliability is poor in the prior art. Among the embodiments of the present disclosure, the substrate includes at least the adhering region and the alignment region adjacent to the adhering region, the covering layer is provided on the base substrate, and a part of the covering layer located at the adhering region includes the adhesive providing region and non-adhesive providing region located at both sides of the adhesive providing region. Further, the grooves are provided on the top of the adhesive providing region of the covering layer, so that the contact area of the adhesive with the covering layer may be increased to produce an anchoring effect, so that the adhesion capability of the adhesive to the substrate may be improved.

Although some embodiments of the present disclosure are described, these are only presented by means of examples, rather than limiting to the scopes of the present disclosure. In practice, the novel embodiments described herein can be implemented by various forms. Various omissions, replacements or changes can be made to the embodiments herein without departing from the spirits of the present disclosure. The attached pending claims and their equivalents are intended to cover such forms or modifications falling within the scope and spirits of the present disclosure.

What is claimed is:
1. An OLED substrate comprising:
   a base substrate, at least comprising an adhering region for adhering the base substrate with other layers and an alignment region for aligning the base substrate with other layers so as to be attached with other layers, the alignment region being adjacent to the adhering region;
   a covering layer disposed on the base substrate, wherein a part of the covering layer located in the adhering region comprises an adhesive providing region in which an adhesive is applied and non-adhesive providing regions in which no adhesive is applied, the non-adhesive providing regions being located at both sides of the adhesive providing region,
   wherein a surface of a side of the covering layer facing toward the base substrate is in direct contact with the base substrate and a groove is provided on a side of the adhesive providing region of the covering layer facing away from the base substrate, and
   wherein the adhesive providing region comprises a first region, a second region and a third region, the second region being located between the first region and the third region, and
   a depth of the groove in the second region is larger than the depth of the groove in each of the first region and the third region.

2. The substrate according to claim 1, wherein the groove has a width not less than about 5 μm.

3. The substrate according to claim 1, wherein an area of a projection of the groove onto the base substrate is not more than about 50% of an area of a projection of the adhesive providing region onto the base substrate.

4. The substrate according to claim 1, wherein a ratio of an area of the second region to an area of the adhesive providing region is in a range of approximately 1% to 99%.

5. The substrate according to claim 1, wherein a ratio of a depth of the groove to a thickness of the covering layer is in a range of about 1%-99%.

6. The substrate according to claim 5, wherein the depth of the groove is not more than 50% of the thickness of the covering layer.

7. The substrate according to claim 1, wherein the substrate further comprises a first protrusion and a second protrusion between the base substrate and the covering layer, and the first and second protrusions are located within the adhering region and located at both sides of the adhesive providing region.

8. The substrate according to claim 7, wherein the substrate further comprises a third protrusion located between the base substrate and the covering layer, the third protrusion being located in the alignment region; and the first protrusion, the second protrusion and the third protrusion comprise metal.

9. The substrate according to claim 1, wherein a material of the covering layer comprises at least one of the followings: silicon oxide, silicon nitride, and a combination thereof, and the base substrate comprises a glass substrate.

10. The substrate according to claim 9, wherein a thickness of the covering layer is in a range of about 500-2000 Å.

11. A display apparatus, comprising the substrate according to claim 1.

12. An OLED method of producing a substrate, comprising:

providing a base substrate at least comprising an adhering region for adhering the base substrate with other layers and an alignment region for aligning the base substrate with other layers so as to be attached with other layers, the alignment region being adjacent to the adhering region;

forming a covering layer on the base substrate, a part of the covering layer located in the adhering region comprising an adhesive providing region and non-adhesive providing regions at both sides of the adhesive providing region;

wherein the method of producing the substrate further comprises keeping a surface of a side of the covering layer facing toward the base substrate being in direct contact with the base substrate and forming a groove on a side of the adhesive providing region of the covering layer facing away from the base substrate, and wherein the adhesive providing region comprises a first region, a second region and a third region, the second region being located between the first region and the third region, and the step of forming the groove comprises forming the groove such that a depth of the groove in the second region is larger than the depth of the groove in each of the first region and the third region.

13. The method according to claim 12, the step of forming the groove comprises:

forming a photoresist on the covering layer;

performing exposure and development processes to form hole-slots on the photoresist, wherein the exposure process is performed by a mask having a first area, a second area and a third area, wherein light transitivity of the first area is larger than that of the second area, and the light transitivity of the second area is larger than that of the third area;

at a portion of the mask which corresponds to the first region and the third region, the second area and the third area are arranged alternately, so that a first hole-slot and a third hole-slot are respectively formed in a region of the photoresist corresponding to the first region and the third region; and at a portion of the mask which corresponds to the second region, the first area and the third area are arranged alternately, so that a second hole-slot is formed in a region of the photoresist corresponding to the second region, wherein a depth of the second hole-slot is larger than that of each of the first hole-slot and the third hole-slot;

performing an etching to penetrate the photoresist so that the grooves are formed in the first region, the second region and the third region of the covering layer; and removing the photoresist.

14. The method according to claim 13, wherein the mask comprises a half-tone mask.

15. The method according to claim 12, wherein a ratio of an area of the second region to an area of the adhesive providing region is in a range of approximately 1% to 99%.

16. The method according to claim 12, wherein the groove has a width not less than about 5 μm; and a ratio of a depth of the groove to a thickness of the covering layer is in a range of about 1%-99%.

17. The method according to claim 12, wherein the method of producing the substrate further comprises:

forming a metal layer on the base substrate, followed by forming the covering layer;

patterning the metal layer to form a first protrusion, a second protrusion and a third protrusion, wherein the first and second protrusions are located within the adhering region and located at both sides of the adhesive providing region; and the third protrusion is located in the alignment region.

18. A method of producing a display apparatus, comprising the method of producing the substrate according to claim 12.

* * * * *